(12) United States Patent
Lissotschenko et al.

(10) Patent No.: US 10,921,582 B2
(45) Date of Patent: Feb. 16, 2021

(54) APPARATUS FOR DEFLECTING AND/OR MODULATING LASER RADIATION

(71) Applicant: LILAS GmbH, Dortmund (DE)

(72) Inventors: Vitalij Lissotschenko, Fröndenberg (DE); Iouri Mikliaev, Cheljabinsk (RU)

(73) Assignee: LILAS GmbH, Dortmund (DE)

( * ) Notice: Subject to any disclaimer, the term of this patent is extended or adjusted under 35 U.S.C. 154(b) by 0 days.

(21) Appl. No.: 16/439,303

(22) Filed: Jun. 12, 2019

(65) Prior Publication Data

US 2019/0339510 A1 Nov. 7, 2019

Related U.S. Application Data

(63) Continuation of application No. PCT/EP2017/081243, filed on Dec. 1, 2017.

(30) Foreign Application Priority Data

Dec. 14, 2016 (DE) .................. 10 2016 124 408

(51) Int. Cl.
*H01S 5/40* (2006.01)
*G02B 26/08* (2006.01)
*G02B 27/09* (2006.01)
*H01S 5/00* (2006.01)

(52) U.S. Cl.
CPC ..... *G02B 26/0858* (2013.01); *G02B 26/0808* (2013.01); *G02B 27/0961* (2013.01); *H01S 5/0071* (2013.01); *H01S 5/4075* (2013.01)

(58) Field of Classification Search
CPC .................................................... H01S 5/4075
See application file for complete search history.

(56) References Cited

U.S. PATENT DOCUMENTS

| 5,059,008 A | * | 10/1991 | Flood | G02B 3/0056 349/202 |
| 6,437,896 B1 | | 8/2002 | Lissotschenko et al. | |
| 6,975,465 B1 | | 12/2005 | Chung et al. | |
| 2003/0063391 A1 | * | 4/2003 | Wang | H01S 5/4025 359/626 |
| 2004/0095983 A1 | * | 5/2004 | Whitley | G02B 19/0014 372/108 |
| 2004/0233408 A1 | | 11/2004 | Sievers | |
| 2007/0052619 A1 | * | 3/2007 | Yeo | G09G 3/02 345/30 |
| 2010/0066823 A1 | * | 3/2010 | Westphal | G02B 21/16 348/79 |
| 2016/0223809 A1 | * | 8/2016 | Pilossof | B41J 2/451 |

FOREIGN PATENT DOCUMENTS

| DE | 19722592 A1 | 12/1997 |
| DE | 10209605 A1 | 10/2002 |
| DE | 10245811 A1 | 5/2003 |
| DE | 102004043895 A1 | 6/2005 |

\* cited by examiner

*Primary Examiner* — Michael Carter
(74) *Attorney, Agent, or Firm* — Edell, Shapiro & Finnan, LLC

(57) ABSTRACT

An apparatus for deflecting and/or modulating a laser radiation, wherein the laser radiation is a plurality of laser beams. The apparatus comprises a plurality of deflecting elements configured as mirror elements or transparent components, and movement apparatus that is capable of moving the plurality of deflecting elements individually or in groups. The movement apparatus comprises a plurality of piezo actuators which are capable of performing a translatory motion.

18 Claims, 13 Drawing Sheets fast axis | slow axis fast axis | slow axis

Fig. 21
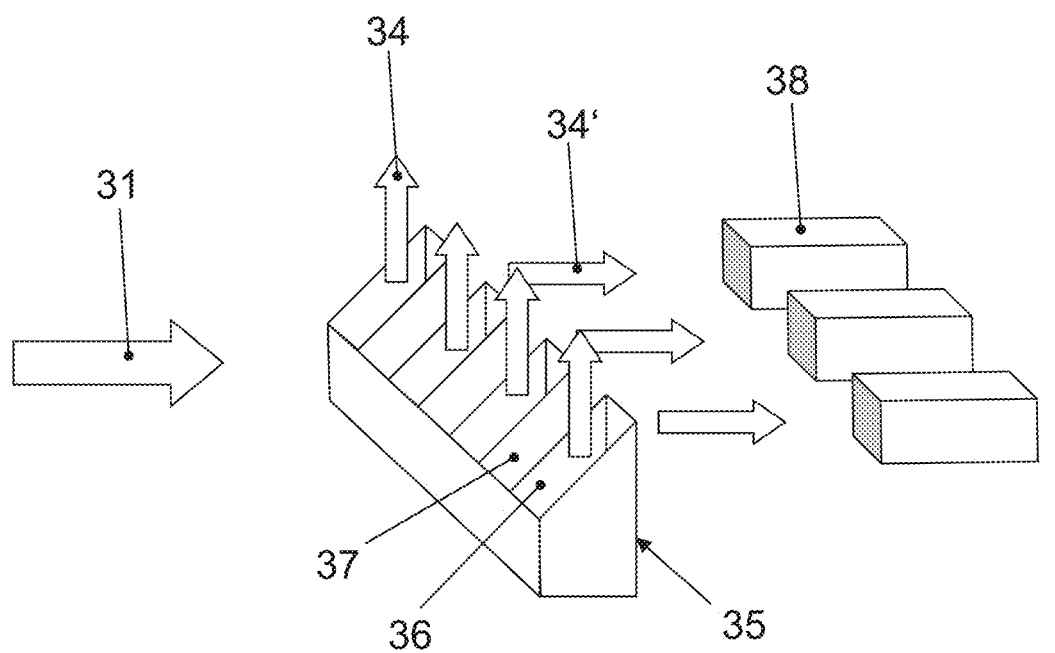
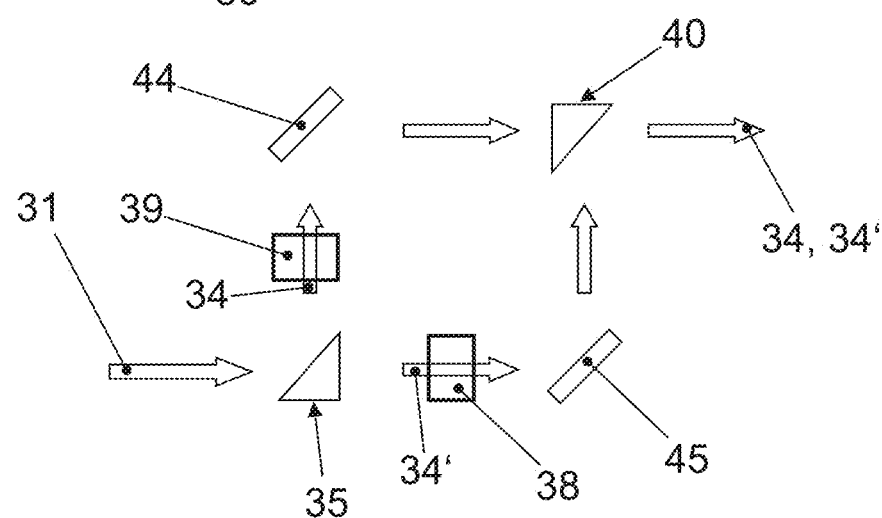
Fig. 22

Fig. 23
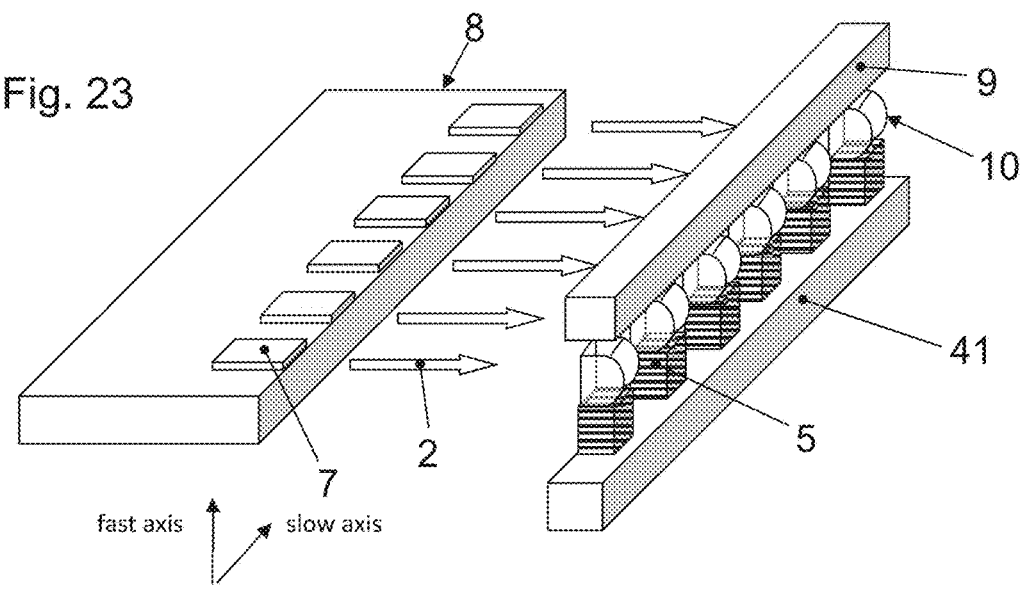
fast axis   slow axis
Fig. 24a
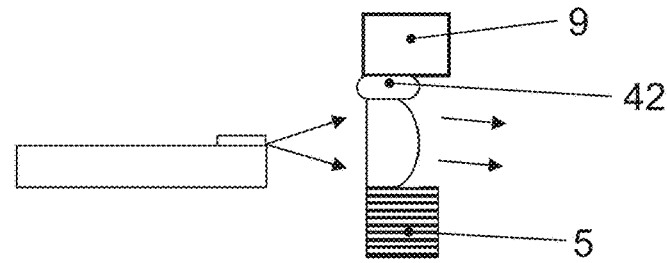
Fig. 24b
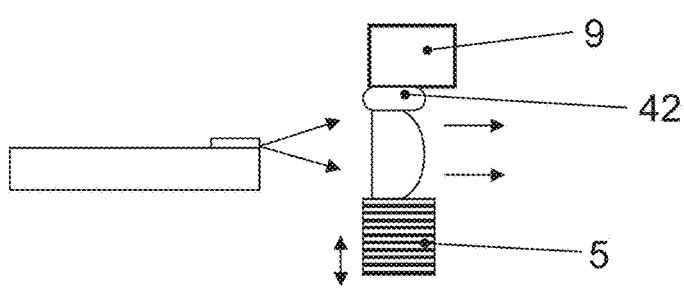
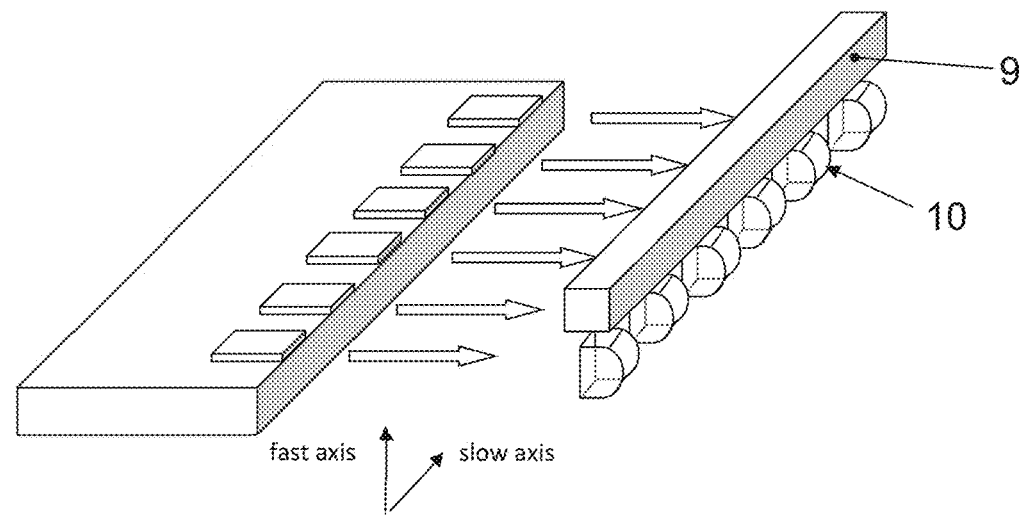
fast axis   slow axis
Fig. 25

APPARATUS FOR DEFLECTING AND/OR MODULATING LASER RADIATION

CROSS REFERENCE TO RELATED APPLICATIONS

This application is a continuation of International Application No. PCT/EP2017/081243, filed on Dec. 1, 2017, which claims priority under 35 U.S.C. § 119(a)-(d) to Application No. DE 102016124408.2 filed on Dec. 14, 2016, the entire contents of which are hereby incorporated by reference.

TECHNICAL FIELD

The disclosure relates to an apparatus for deflecting and/or modulating a plurality of laser beams.

BACKGROUND

Definitions: "In the direction of propagation of the laser radiation" denotes the mean direction of propagation of the laser radiation, especially if it is not a plane wave or is at least partially divergent. The terms laser beam, light beam, partial beam or beam do not refer, unless explicitly stated otherwise, to an idealized beam of the geometric optics, but rather to a real light beam, such as, for example, a laser beam that does not have an infinitesimally small, but rather an extended beam cross section.

An apparatus of the type mentioned in the introductory part is known. For example, galvanometer-based deflecting mirrors are used. One drawback with these systems is usually the fact that only comparatively low laser power levels can be used. However, in particular, in the case of 3D printing systems, high power levels have to be quickly modulated.

SUMMARY

The problem, on which the present disclosure is based, is the provision of an apparatus of the type that is mentioned in the introductory part and that can be used for higher laser power levels. Furthermore, the objective of the present disclosure is to disclose a method for a compensation of the smile of a laser diode bar.

This object is achieved in accordance with an example implementation by an apparatus of the type that is mentioned in the introductory part and that exhibits the features disclosed herein.

According to an example implementation, it is provided that movement apparatus comprising at least one actuator, preferably a plurality of actuators, in particular, at least one piezo actuator, where the actuator(s) is/are capable of performing a translatory motion. As a result, rapid movements can be transmitted to deflecting elements that can then modulate the laser radiation in a suitable manner. Owing to the selected drive principle, the deflecting elements can be designed such that they lend themselves to deflecting or alternatively to modulating high laser power levels, a feature that is required, for example, in 3D printing apparatuses.

It can be provided that each of the deflecting elements is assigned an actuator that can move the deflecting element associated with the actuator. In particular, the deflecting element can be displaced and/or pivoted about an axis.

For example, the deflecting elements are designed as mirror elements. Mirror elements, which can be pivoted by a piezo actuator, can be designed such that even laser beams of very high power can be deflected without destroying the mirror element.

In addition or as an alternative, the deflecting elements may be designed as a transparent component, through which the laser radiation to be deflected, in particular, the laser beam to be deflected, can pass.

For example, the transparent component may be a plane-parallel plate. The plate can be pivoted, so that this results in a variable beam offset.

As an alternative, the transparent component may be a lens or a lens segment. A beam deflection can also be effectively achieved by moving a lens or a lens segment.

There is the option that each of the deflecting elements comprises two transparent components, which are opposite one another and through which the laser radiation to be deflected, in particular, the laser beam to be deflected, can pass, wherein the two components can be moved relative to each other, in particular, in a direction perpendicular to the direction of propagation of the laser radiation, in particular, the laser beam. Preferably the components may have mutually corresponding contours that are arranged, in particular, on opposite sides of the components. A beam deflection can also be effectively achieved by displacing the components with respect to each other.

It can be provided that the deflecting elements are arranged side by side, in particular, in a direction perpendicular to the direction of propagation of the laser radiation, in particular, the laser beams. Furthermore, there is the option that the laser radiation, in particular, the laser beams, emanate from a laser diode bar, wherein, in particular, each one of the emitters of the laser diode bar emits one of the laser beams. By arranging the deflecting elements side by side, for example, in the direction of the slow axis, the laser beams of a laser diode bar that are arranged next to one another can be simultaneously deflected or alternatively modulated.

It can be provided that the apparatus can be used to compensate for the smile of a laser diode bar.

There is the option that the deflecting elements comprise two mirror elements that are arranged such that in each case a part of a laser beam is reflected at each of the two mirror elements when the apparatus is in operation, wherein a second of the mirror elements can be moved relative to a first of the mirror elements by an actuator, so that when the mirror elements are suitably positioned with respect to each other, the intensity of the laser beam in a working plane is reduced by destructive interference. Thus, the intensity of individual laser beams in a working plane can be significantly to completely reduced in a targeted way by the mirror elements, so that, on the whole, a laser radiation, consisting of a plurality of laser beams, can be suitably modulated. As a result, this implementation of an apparatus in accordance with the present disclosure is also suitable, for example, for use in a 3D printing apparatus.

According to an example implementation, it is provided that a plurality of deflecting elements are transferred individually or in groups by movement apparatus into such a position and/or location that, as a result thereof, the smile distortion of the laser diode bar is corrected. For example, an apparatus in accordance with the example implementation can be used to carry out the method.

It can be provided that the plurality of deflecting elements are secured after having been transferred into the smile compensating position and/or location, so that the movement apparatus is no longer needed. In this way, an apparatus in accordance with the example implementation makes it possible to compensate for the smile of a plurality of laser diode bars.

BRIEF DESCRIPTION OF THE DRAWINGS

Other features and advantages of the described apparatus will become apparent from the following description of example implementations with reference to the accompanying drawings, wherein:

FIG. 21 is a perspective view of a detail of a twelfth example implementation of an apparatus in accordance with the disclosure;

FIG. 22 is in schematic form a side view of the example implementation, according to FIG. 21;

FIG. 23 is a perspective view of a thirteenth example implementation of an apparatus in accordance with the disclosure;

FIG. 24a is in schematic form a side view of the example implementation, according to FIG. 23, prior to carrying out the smile compensation;

FIG. 24b is in schematic form a side view of the example implementation, according to FIG. 23, after the smile compensation has been performed;

FIG. 25 is a perspective view of the example implementation, according to FIG. 23, after the smile compensation has been performed and the movement apparatus has been removed;

DETAILED DESCRIPTION

Figure 1:
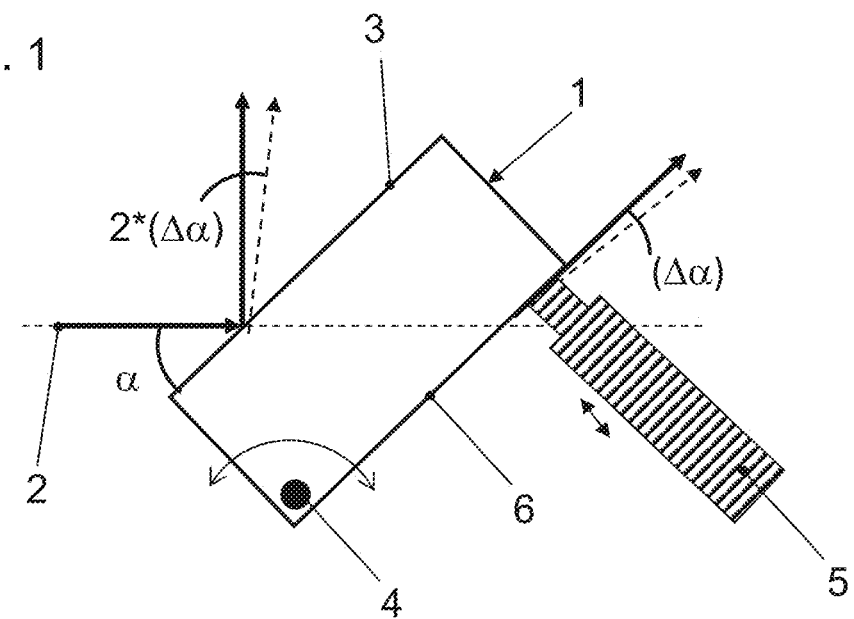
FIG. 1 is in schematic form a side view of a first example implementation of an apparatus in accordance with the disclosure.

Identical or functionally identical parts are provided with the same reference numerals in the figures.

Apparent from FIG. 1 is an apparatus that comprises a plurality of deflecting elements that are designed as mirror elements 1. A laser beam 2, coming from the left in FIG. 1, impinges on a reflective surface 3 of the mirror element 1 at an angle $\alpha$ and is reflected from the reflective surface. The mirror element 1 can be pivoted about an axis 4.

A piezo actuator 5 acts at a distance from the axis 4 on a surface 6, located opposite the reflective surface 3. By changing the length of the piezo actuator 5, for example, by small distances in the range of 1 μm to 3 μm, the mirror element 1 is pivoted about the axis 4. FIG. 1 shows that, in so doing, a change in the angle between the laser beam 2 and the surface 6 by an angle $\Delta\alpha$ leads to a deflection by an angle $2*\Delta\alpha$.

Figure 2:
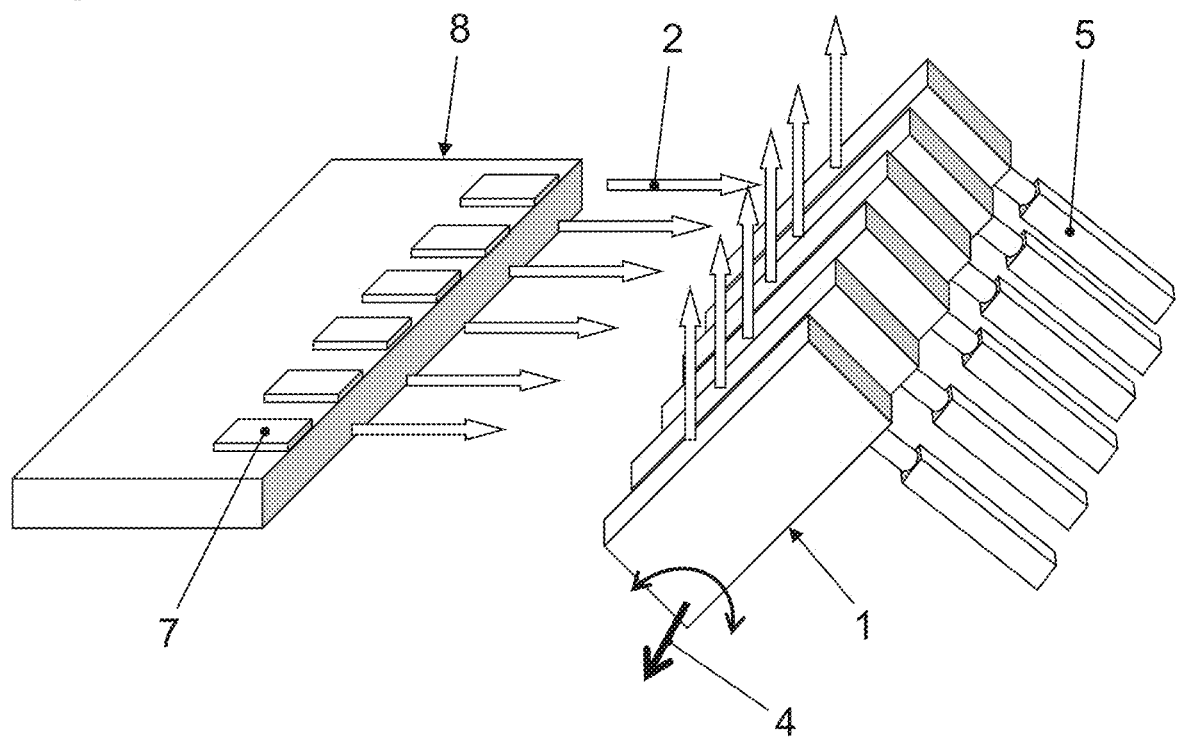
FIG. 2 is a perspective view of the example implementation, according to FIG. 1, with a laser apparatus.

FIG. 2 illustrates how the laser beams 2, emanating from the emitters 7 of a laser diode bar 8, are reflected at a plurality of mirror elements 1. In this case, each of the emitters 7 or, more specifically, each laser beam 2, emanating from one of the emitters 7, is assigned exactly one mirror element 1, which is used as a deflecting element. In the position in FIG. 2, all of the laser beams 2 are reflected in the same direction. The slow axis and the fast axis of the laser diode bar 8 are indicated in some of the figures.

Figure 3:
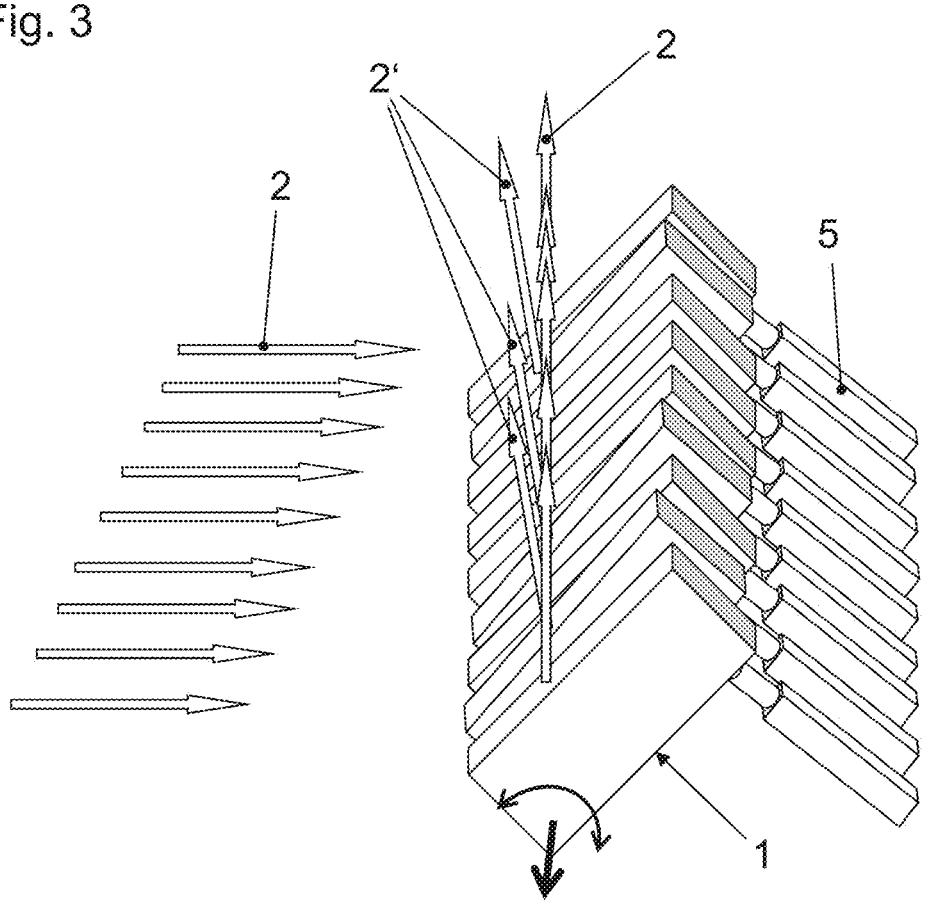
FIG. 3 is a view that corresponds to FIG. 2 and depicts the example implementation from FIG. 1, wherein three laser beams are deflected.

In the position in FIG. 3, three laser beams 2' are reflected in a direction that deviates from the direction, in which the other laser beams 2 are reflected. For example, these three laser beams 2' can be directed into a beam trap, so that they do not contribute to the process to be carried out. For example, a 3D printer, which is equipped with the apparatus, cannot apply laser radiation in this way to locations, where no solidification of a starting material is supposed to take place in this way.

Figure 4:
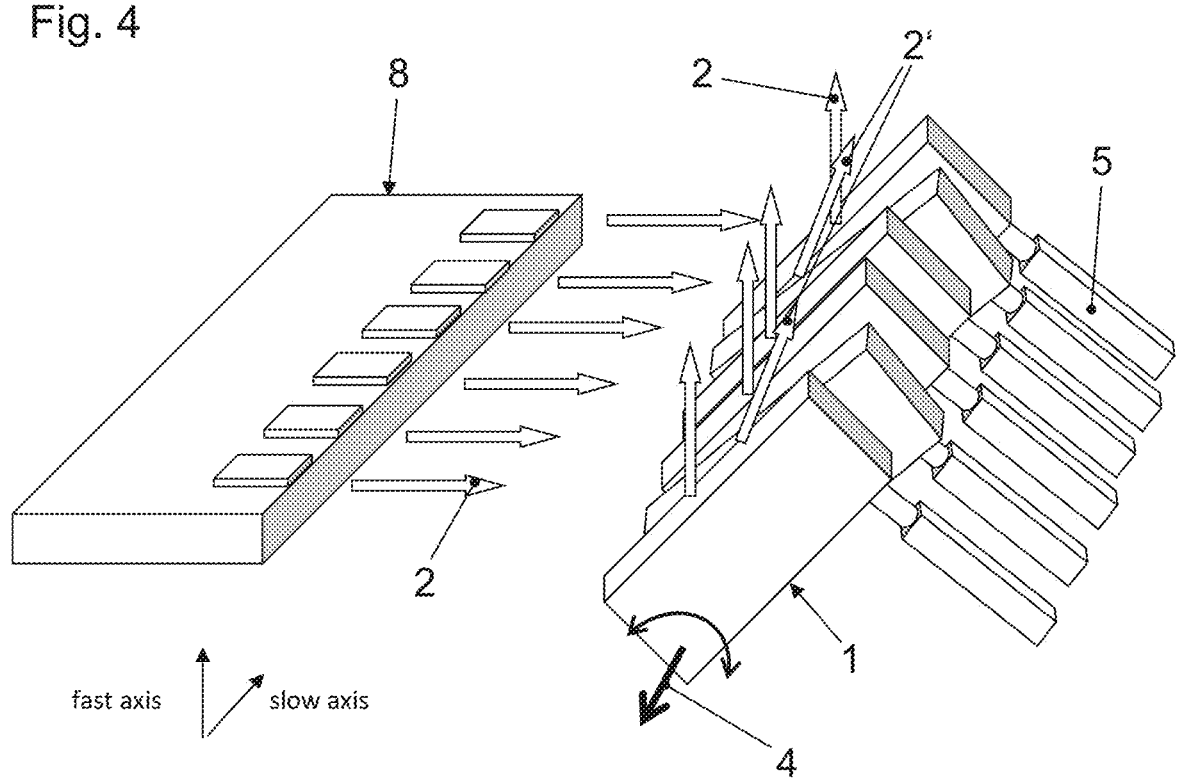
FIG. 4 is a view that corresponds to FIG. 2 and FIG. 3 and depicts the example implementation from FIG. 1, wherein two laser beams are deflected.

In FIG. 4, two laser beams 2' are reflected in a direction that deviates from the direction in which the other laser beams 2 are reflected. In contrast to FIG. 3, in FIG. 4 the laser beams 2', which do not contribute to the process, are deflected to the right, whereas in FIG. 3 they are deflected to the left.

Figure 5:
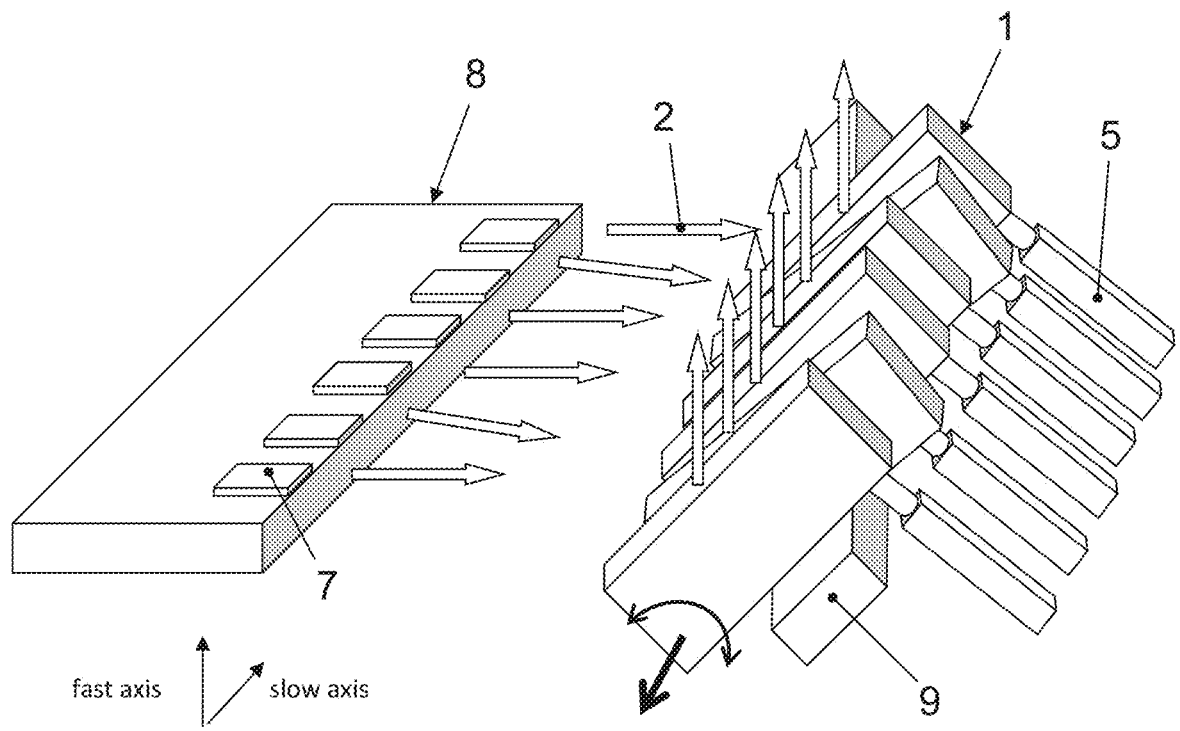
FIG. 5 is a view that corresponds to FIG. 2 and depicts the example implementation from FIG. 1, wherein the apparatus is used to compensate for the smile.

FIG. 5 shows the use of an apparatus of the example implementation for the purpose of compensating for a smile distortion that often occurs in laser diode bars 8. The mirror elements 1, which are assigned to the individual emitters 7, are in such angular positions that the smile distortion is optimally compensated for. This state can be achieved, for example, in that the laser beams 2, emanating from the mirror elements 1, are detected and in response to the detection the piezo actuators 5 are specifically driven such that all of the laser beams 2 are reflected from the mirror elements 1 in the same direction.

Figure 6:
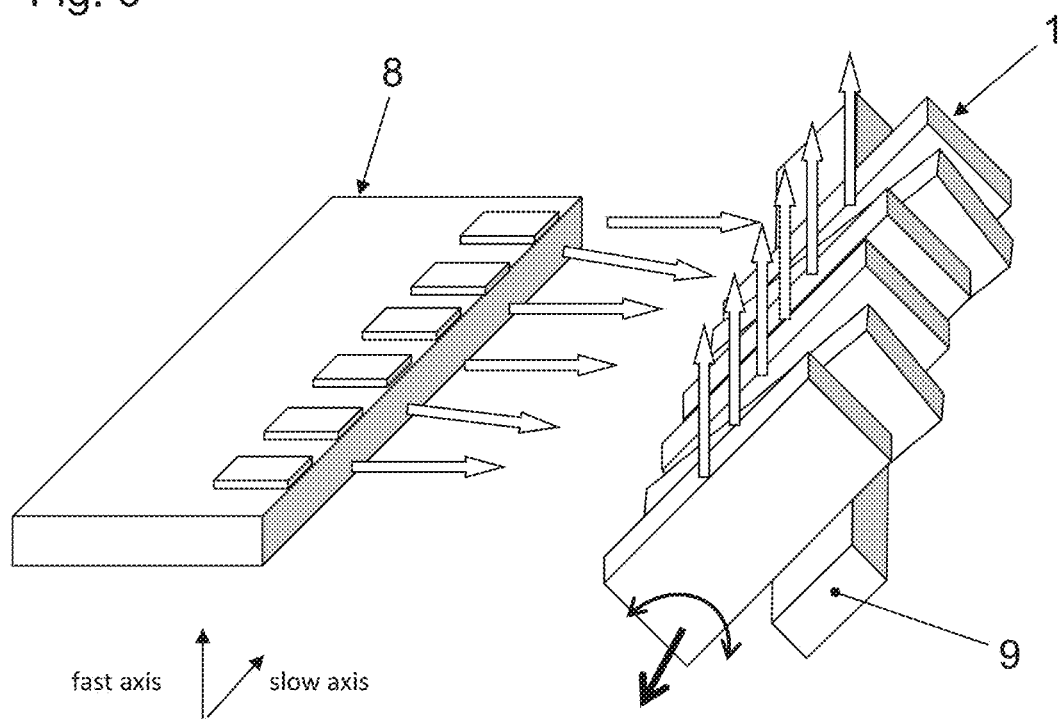
FIG. 6 is a view that corresponds to FIG. 5 and in which the movement apparatus has been removed after completion of the smile compensation.

In FIG. 5, a fastening element 9 in the form of a rod is indicated. After the inclinations of the mirror elements 1 have been suitably adjusted to compensate for the smile, the mirror elements are secured by connecting to the fastening element 9, for example, by gluing. Thereafter, the piezo actuators 5 can be removed (see, for example, FIG. 6).

Figure 7:
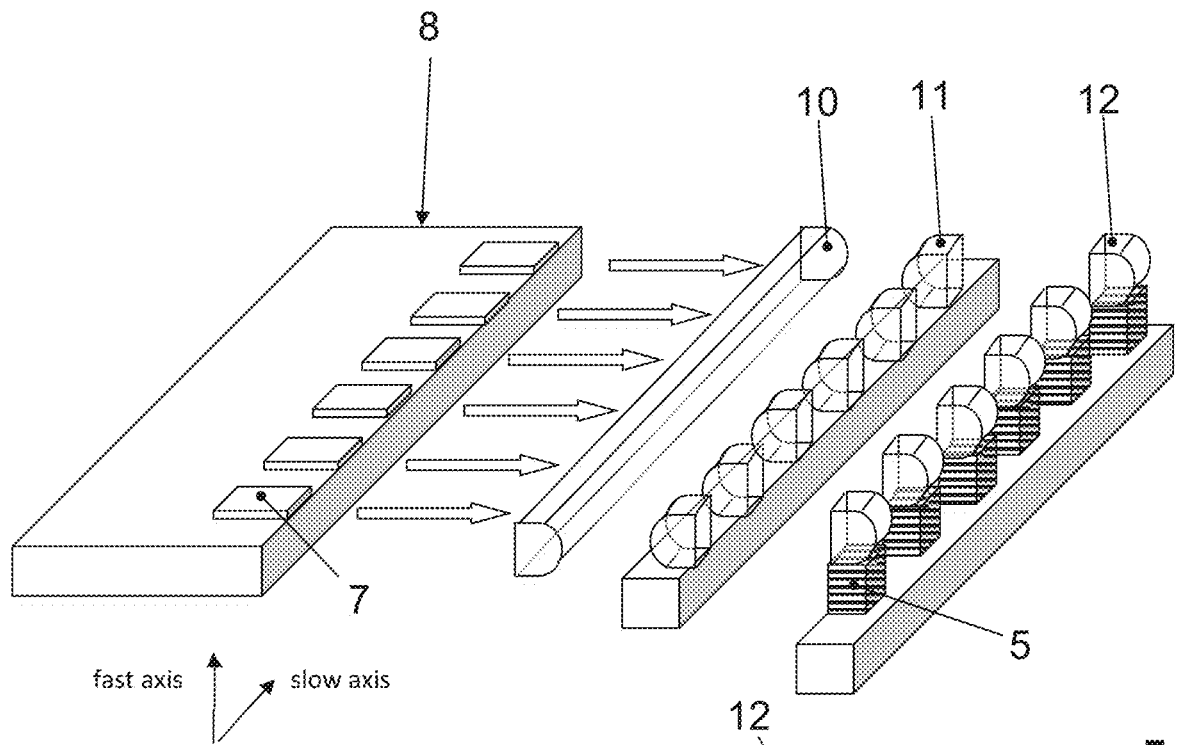
FIG. 7 is a perspective view of a second example implementation of an apparatus in accordance with the disclosure.

In FIG. 7, a fast axis collimating lens 10 is arranged behind the laser diode bar 8. Behind the fast axis collimating lens there are disposed deflecting elements, which are designed as lens segments 11, 12. In particular, a plurality of first lens segments 11, arranged next to one another in the direction of the slow axis, and a plurality of second lens segments 12, arranged next to one another in the direction of the slow axis, are provided. In this case, the first and the second lens segments 11, 12 are spaced apart from one another in the direction of propagation of the laser beams 2 such that a telescopic arrangement is produced.

The shape of the first and the second lens segments 11, 12, respectively, corresponds to the shape of the fast axis collimating lens 10. In particular, they are designed, like the fast axis collimating lens 10, as cylindrical lenses with cylinder axes that extend in the direction of the slow axis.

Figure 8:
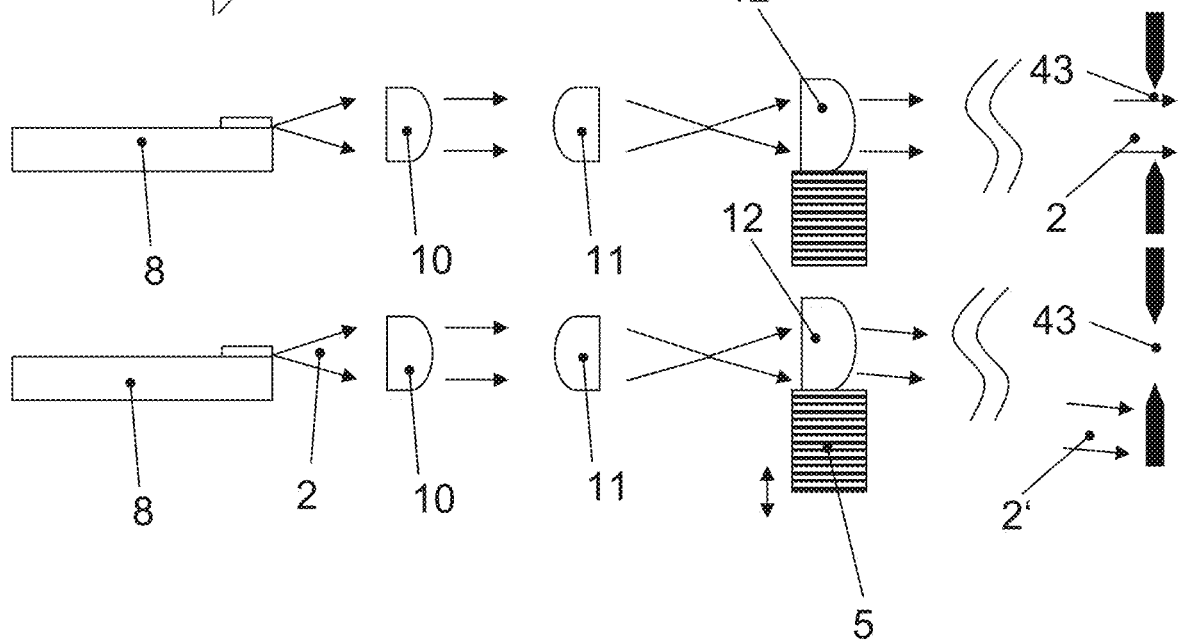
FIG. 8 is in schematic form a side view of the example implementation according to FIG. 7.

Each of the second lens segments 12 is assigned a piezo actuator 5, which can move the corresponding lens segment 12 upwards and/or downwards as shown in FIG. 8 or, more specifically, in the direction of the fast axis. In this case, too, a very small displacement from the non-deflecting position, shown in the illustration at the top in FIG. 8, into a deflecting position, indicated in the illustration shown at the bottom in FIG. 8, may be sufficient to deflect the laser beam 2' such that it is intercepted by, for example, the boundaries of an aperture 43, indicated in FIG. 8. A displacement of, for example, 1 µm to 3 µm may be quite sufficient to achieve the deflection, indicated in the illustration shown at the bottom in FIG. 8.

Figure 9:
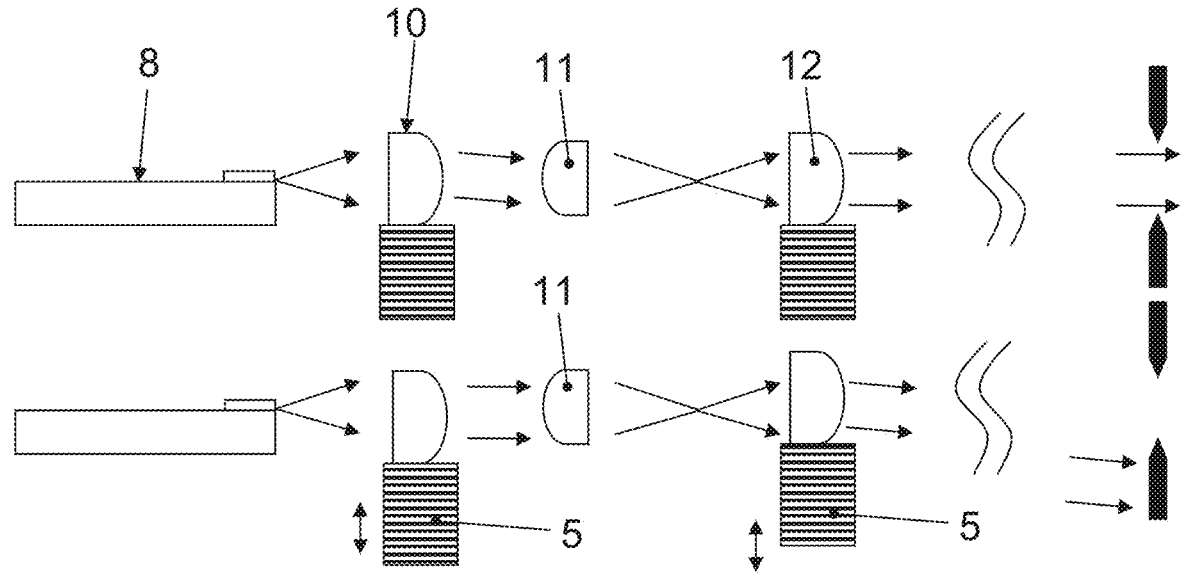
FIG. 9 is in schematic form a side view of a third example implementation of an apparatus in accordance with the disclosure.

In the example implementation according to FIG. 9, the fast axis collimating lens 10 is subdivided into individual segments, wherein the individual segments of the fast axis collimating lens 10 can also be moved upwards and downwards as shown in FIG. 9 by a respective piezo actuator 5. In this way, a smile compensation can be achieved by targeted positioning of the individual segments of the fast axis collimating lens 10, whereas a targeted deflection of individual laser beams 2' or, alternatively, a modulation of the laser radiation can be achieved by the targeted positioning of the second lens segments 12.

Figure 10:
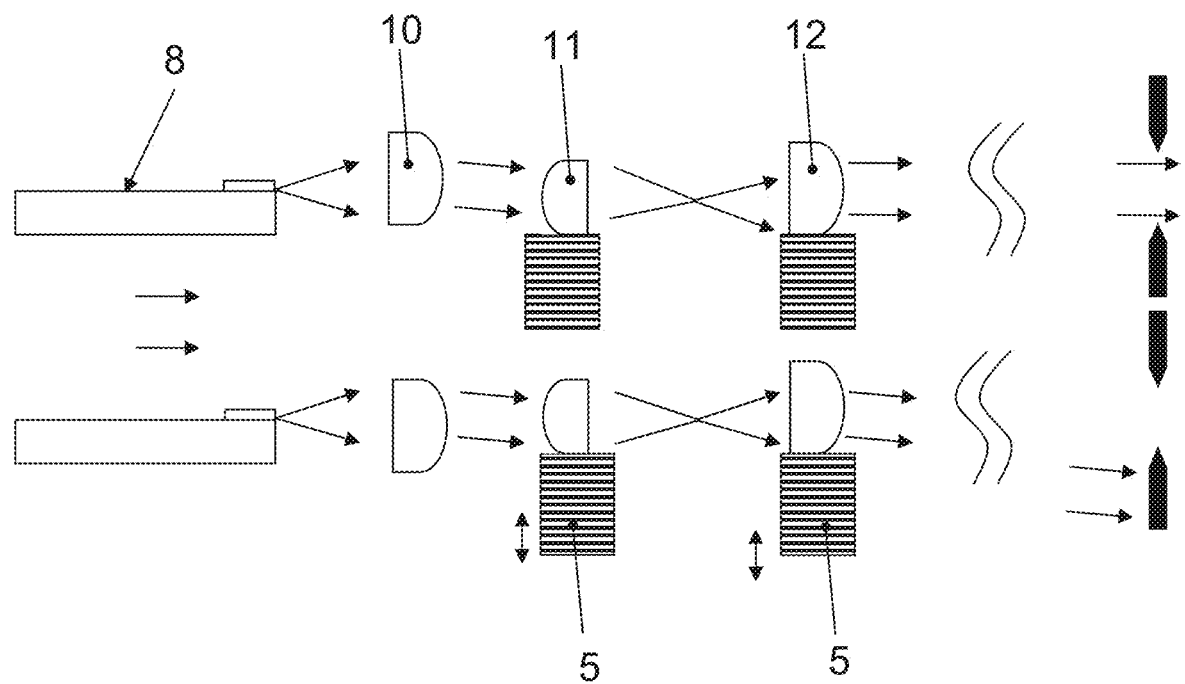
FIG. 10 is in schematic form a side view of a fourth example implementation of an apparatus in accordance with the disclosure.

In the example implementation according to FIG. 10, the fast axis collimating lens 10 is not subdivided into individual segments. In this example implementation, the connection of each of the first lens segments 11 to a piezo actuator 5, which can position each of the first lens segments 11 in a targeted manner, is used to compensate for the smile. As in FIG. 9, a targeted deflection of the individual laser beams 2' or, alternatively, a modulation of the laser radiation can be achieved by the targeted positioning of the second lens segments 12.

Figure 11:
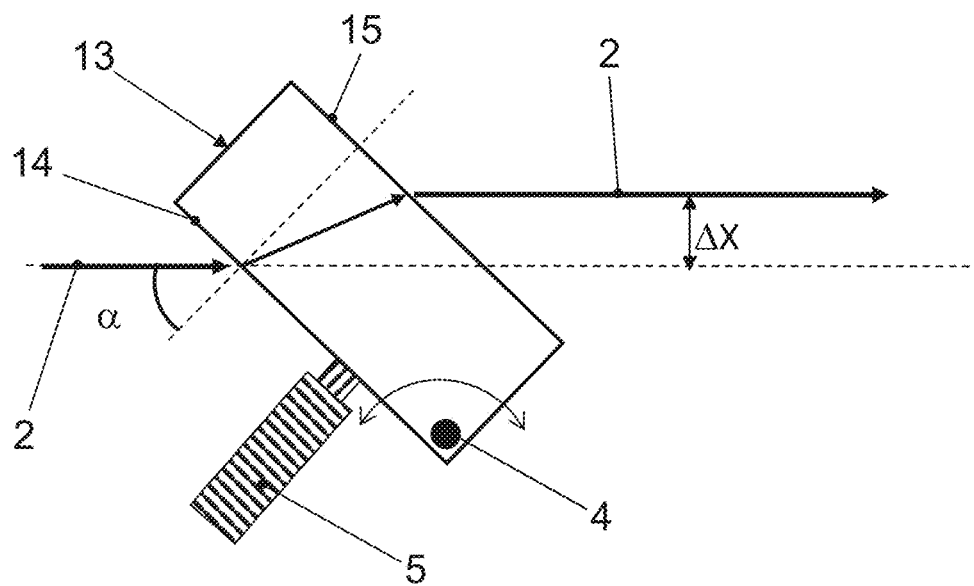
FIG. 11 is in schematic form a side view of a fifth example implementation of an apparatus in accordance with the disclosure.

Apparent from FIG. 11 is an apparatus that comprises a plurality of deflecting elements designed as transparent components 13. The components 13 are, in particular, plane-parallel plates. A laser beam 2, coming from the left in FIG. 11, passes through a first surface 14 of the component 13 at an angle $\alpha$, thus entering into this component, and issues again from the opposite second surface 15 to exit the component 13. In this case, the laser beam 2 undergoes a beam offset $\Delta X$.

Figure 12:
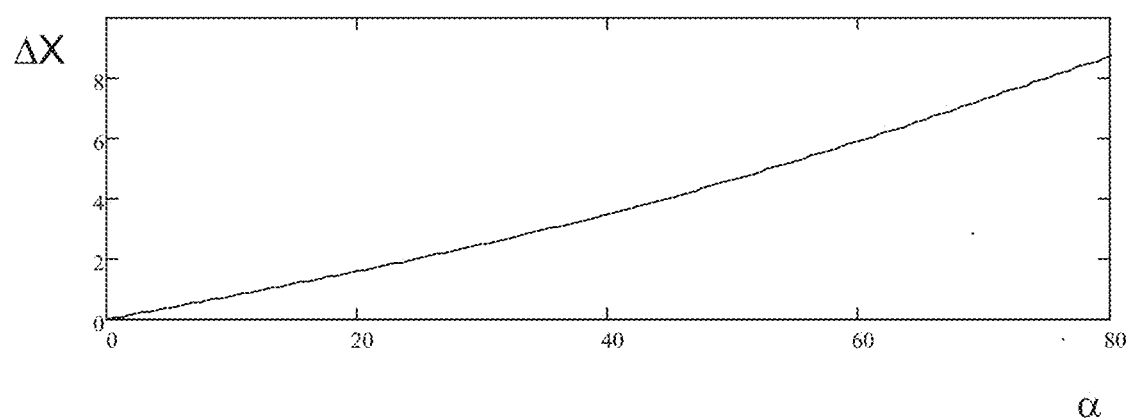
FIG. 12 is a graph, in which the deflection with the fifth example implementation of an apparatus is plotted against the entry angle.
Figure 13:
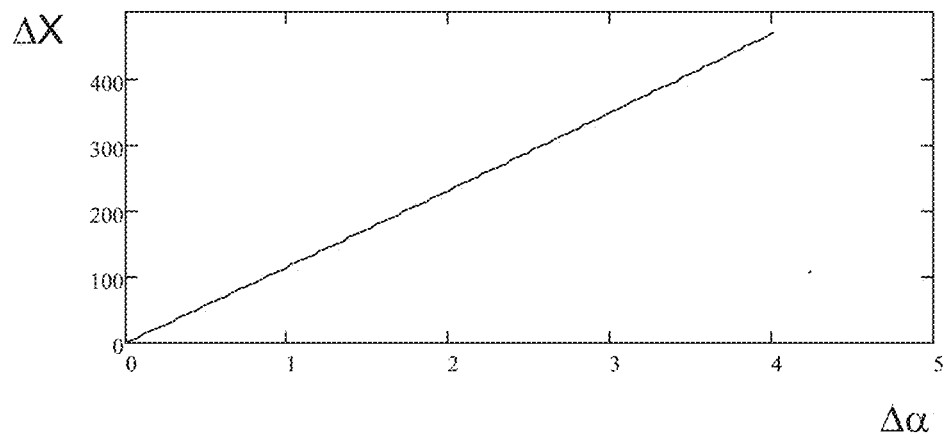
FIG. 13 is a graph, in which the deflection with the fifth example implementation of an apparatus is plotted against the change in the entry angle.

The component 13 can be pivoted about an axis 4. A piezo actuator 5 acts at a distance from the axis 4 on the first surface 14. By changing the length of the piezo actuator 5, for example, by small distances in the range of 1 µm to 3 µm, the component 13 is pivoted about the axis 4. FIG. 12 shows that in this case the beam offset $\Delta X$ is essentially linear from the angle $\alpha$ between the laser beam 2 and the first surface 14. FIG. 13 illustrates that a change $\Delta \alpha$ in the angle $\alpha$ between the laser beam 2 and the first surface 14 leads to a change in the beam offset $\Delta X$.

Figure 14:
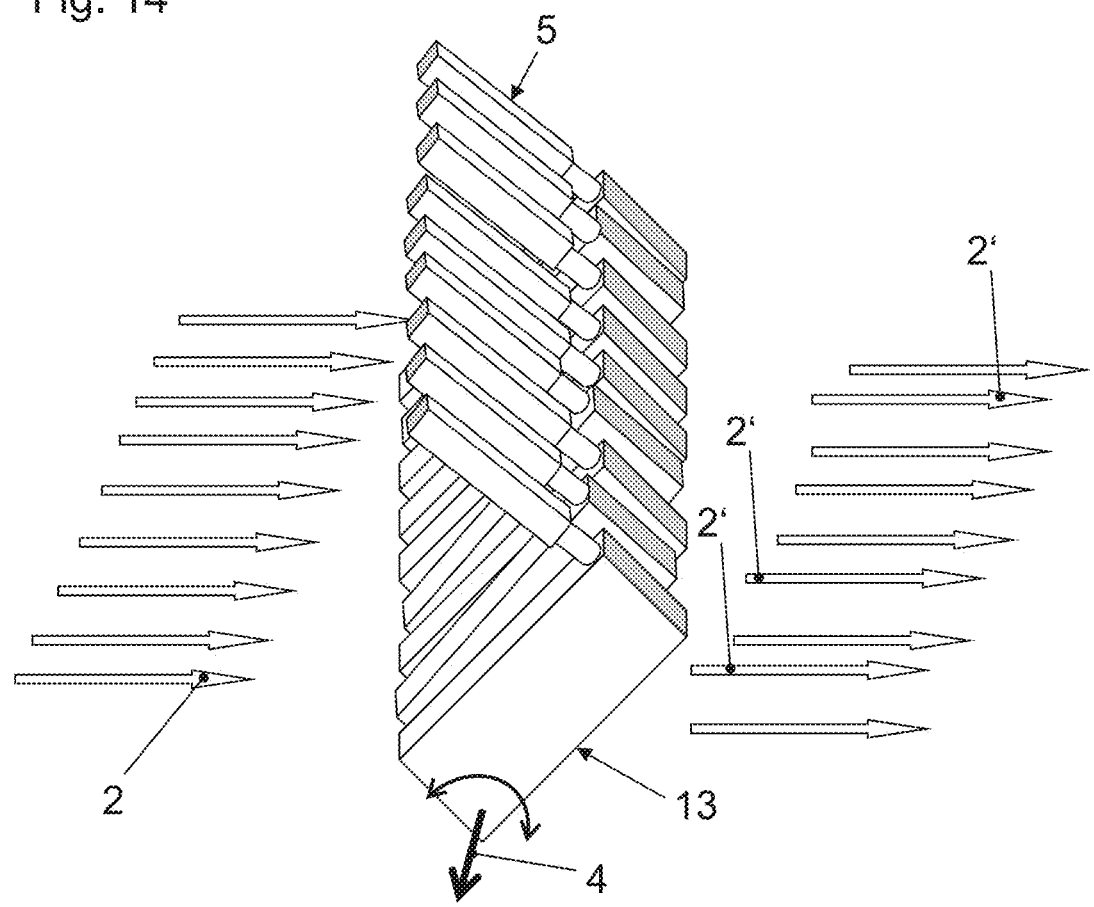
FIG. 14 is a perspective view of the example implementation, according to FIG. 11, with a laser apparatus.

FIG. 14 illustrates how laser beams 2 pass through a plurality of components 13. In this case, each laser beam 2 is assigned exactly one component 13 that serves as a deflecting element. In the position in FIG. 14, three laser beams 2' are offset differently than the other laser beams 2. For example, these three laser beams 2' that are offset differently can be directed into a beam trap, so that they do not contribute to the process to be carried out. For example, a 3D printer, equipped with the apparatus, cannot apply laser radiation in this way to locations, where no solidification of a starting material is supposed to take place in this way.

Figures 15A, 15B:
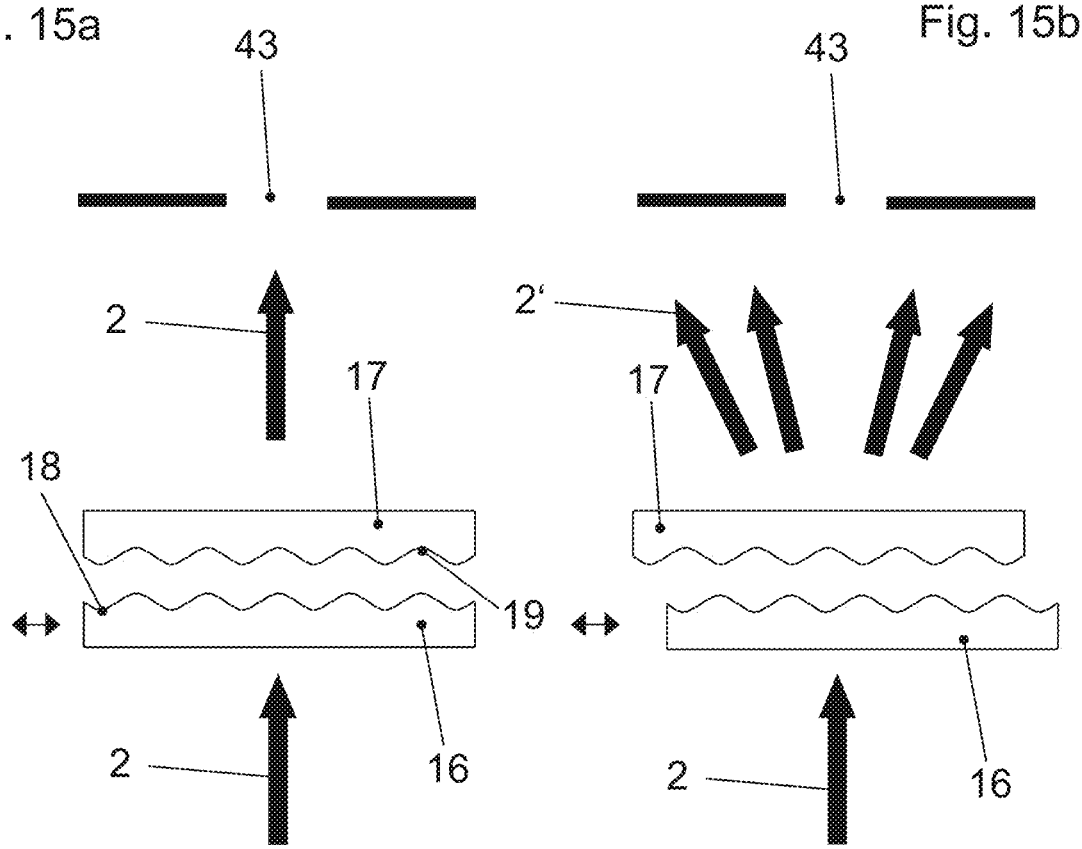
FIG. 15a is in schematic form a plan view of a sixth example implementation of an apparatus in accordance with the disclosure showing a position of the deflecting elements, in which a laser beam is not deflected.
FIG. 15b is in schematic form a plan view of the apparatus, according to FIG. 15a, showing a position of the deflecting elements, in which a laser beam is deflected.

Apparent from FIG. 15a and FIG. 15b is an apparatus that comprises a plurality of deflecting elements designed as transparent components 16, 17. In this case, each of the deflecting elements comprises two transparent components 16, 17, which are opposite one another and through which the laser beam 2, which is to be deflected, can pass. The components 16, 17 have mutually corresponding contours 18, 19 that are arranged, in particular, on opposite sides of the components 16, 17. In the illustrated example implementation, for example, it is a sinusoidal contour 18, 19.

The two components 16, 17 can be moved relative to one another, in particular, in a direction perpendicular to the direction of propagation of the laser beam 2. This can be done by a respective piezo actuator, which acts, for example, on the left side of the first component 16 in FIGS. 15a and 15b. The change in length of the piezo actor may, for example, also be between 1 µm to 10 µm, in particular, between 1 µm and 3 µm.

FIG. 15a shows a position in which the components 16, 17 are not displaced with respect to one another. In this position, a wave crest of the contour 18 of the first component 16 is exactly opposite a wave trough of the contour 19 of the second component. As a result, it is ensured that the laser beam 2 will pass through the two components 16, 17 without being deflected and, for example, will pass through a downstream aperture 43.

FIG. 15b shows a position in which the components 16, 17 are displaced with respect to one another. In this position, a wave crest of the contour 18 of the first component 16 is exactly opposite a wave crest of the contour 19 of the second component. As a result, it is ensured that the laser beam 2 will pass through the two components 16, 17 in the deflected state and, for example, will not pass through a downstream aperture 43.

In particular, this feature can be explained by the fact that the components 16, 17 act as diffraction gratings. When the components 16, 17 are not displaced with respect to one another, a diffraction occurs almost exclusively in the zero order, so that the laser beam 2 passes through the assembly without any hindrance. When the components 16, 17 are displaced with respect to one another, a diffraction occurs almost exclusively in higher orders, so that a plurality of deflected laser beams 2' emerge from the assembly.

Figure 16:
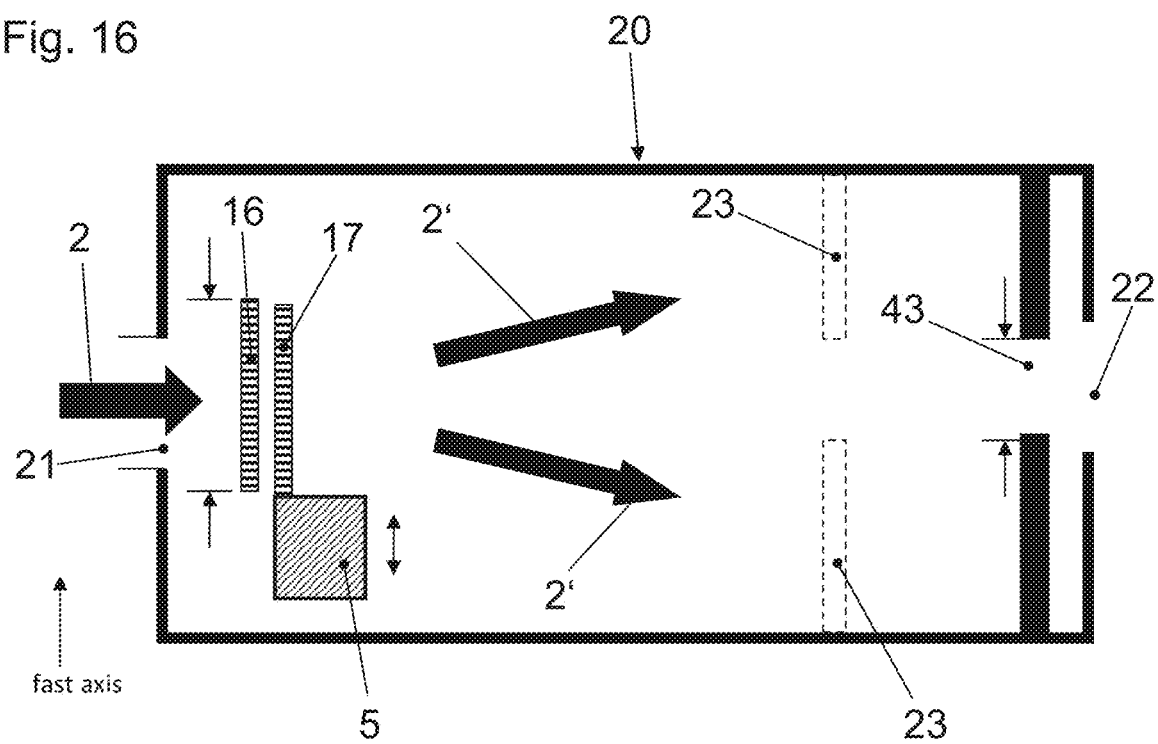
FIG. 16 is in schematic form a plan view of a seventh example implementation of an apparatus in accordance with the disclosure.

FIG. 16 shows an example of an application of the apparatus according to FIGS. 15a and 15b, in which the components 16, 17 are arranged in a housing 20. The housing 20 has an entry opening 21 for the laser beam 2 and an exit opening 22, in front of which the aperture 43 is arranged. In the state depicted in FIG. 16, the second component 17 has been moved relative to the first component 16 by a piezo actuator 5 such that a plurality of deflected laser beams 2' leave the components 16, 17 at the same time, but no laser beam 2 passes through the aperture 43.

In this case, the deflected laser beams 2' are directed into a beam trap 23, which is indicated by a dashed line in FIG. 16, so that the laser beams do not contribute to the process to be carried out. For example, a 3D printer, which is equipped with the apparatus, cannot apply laser radiation in this way to locations, where no solidification of a starting material is supposed to take place in this way.

Figure 17:
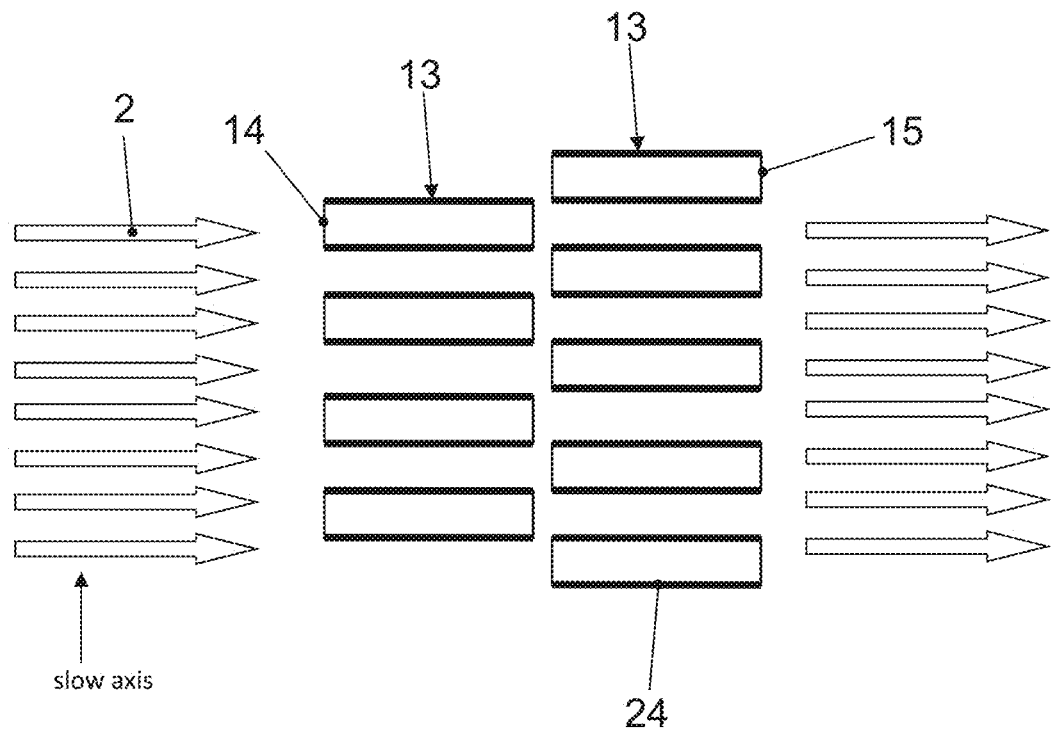
FIG. 17 is in schematic form a plan view of an eighth example implementation of an apparatus in accordance with the disclosure.

FIG. 17 shows the offset arrangement of the deflecting elements, which are designed as transparent components 13. In this case, the adjacent components 13 in the direction of the slow axis are offset with respect to one another by more than one length of the components 13 in their longitudinal direction, so that the adjacent components are arranged such that they are offset one behind the other. As a result, the laser beams 2, arriving from the left in FIG. 17, can be arranged closer to one another.

The components 13 are provided with a highly reflective coating on their longitudinal sides 24 and with a reflection-reducing coating on their end faces 14, 15, which serve as the entry and exit surfaces, respectively.

Figure 18:
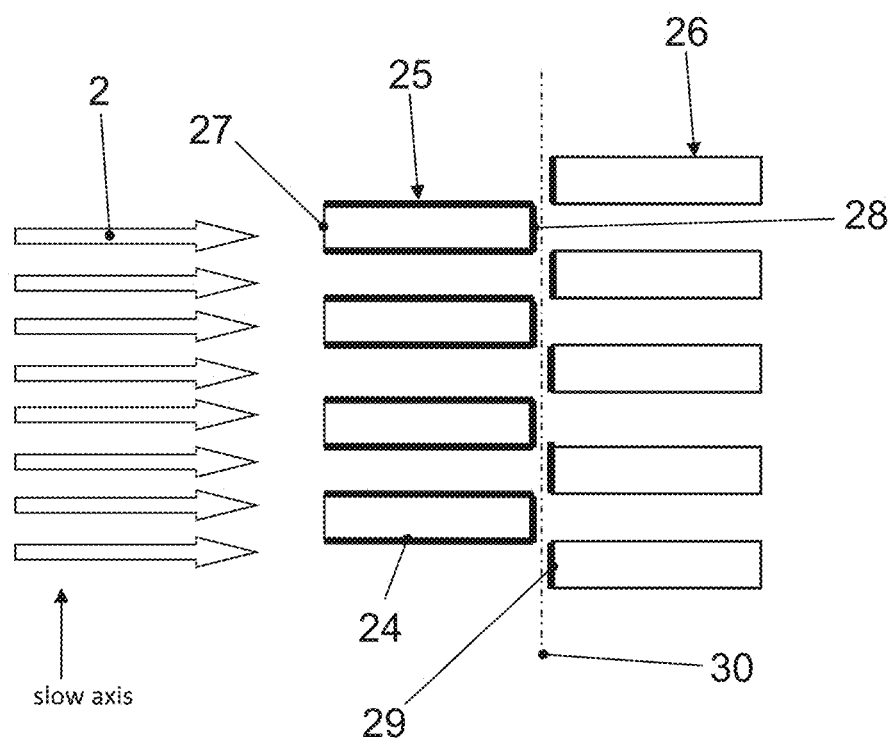
FIG. 18 is in schematic form a plan view of a ninth example implementation of an apparatus in accordance with the disclosure.

FIG. 18 shows the offset arrangement of the deflecting elements, designed as mirror elements 25, 26. The mirror elements 25, 26 are pivoted or, more specifically, are pivotable, like the mirror element 1 depicted in FIG. 1, about an axis, so that the laser beams 2, incident from the left in FIG. 18, are deflected out of the plane of the drawing in FIG. 18. In this case, the adjacent mirror elements 25, 26 in the direction of the slow axis are offset with respect to one another by more than one length of the mirror elements 25, 26 in their longitudinal direction, so that the adjacent mirror elements are arranged in an offset manner one behind the other. As a result, the laser beams 2, arriving from the left in FIG. 18, can be arranged closer to one another.

The mirror elements 25, which are arranged on the left side in FIG. 18, are provided at least partially with a highly reflective coating on their upper and lower longitudinal sides 24 in FIG. 18. On their left side, the mirror elements 25, arranged on the left side in FIG. 18, have an entry surface 27, which is provided with a reflection-reducing coating. On the right side of the mirror elements 25 in FIG. 18, a highly reflective coating 28 is provided. From this coating, the respective laser beam 2 is reflected out of the plane of the drawing in FIG. 18.

The mirror elements 26, which are arranged on the right side in FIG. 18, have a highly reflective coating 29 on their left side in FIG. 18; and from the coating the respective laser beam 2 is reflected out of the plane of the drawing in FIG. 18. Owing to the varying configuration of the mirror elements 25, 26, it is ensured that the laser beams 2, which are reflected from the various mirror elements 25, 26 out of the plane of the drawing in FIG. 18, are reflected in approximately the same area (see the dash-dotted line 30 shown in FIG. 18).

Figure 19:
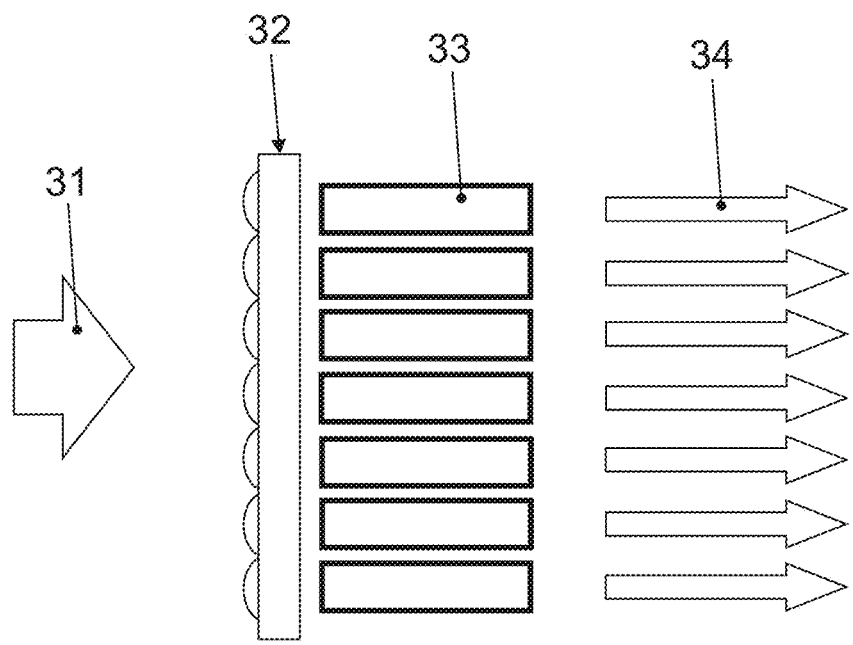
FIG. 19 is in schematic form a plan view of a tenth example implementation of an apparatus in accordance with the disclosure.

FIG. 19 shows an example implementation of the disclosure, in which on the input side there is not a plurality of laser beams, but rather there is a laser radiation 31 with a linear intensity distribution, with the line of the linear intensity distribution extending in the vertical direction in FIG. 19. The apparatus comprises a lens array 32, by which the laser radiation 31 is split into individual partial beams 34 and is supplied to a corresponding number of deflecting elements 33. These deflecting elements 33 may be designed, for example, as mirror elements or as transparent components.

Thus, it is possible for the deflecting elements 33 to deflect specifically individual ones of the partial beams 34 in a different way than others, so that, on the whole, the laser radiation 31 can be suitably modulated. As a result, this example implementation of an apparatus in accordance with the disclosure is also suitable, for example, for use in a 3D printing apparatus.

Figure 20:
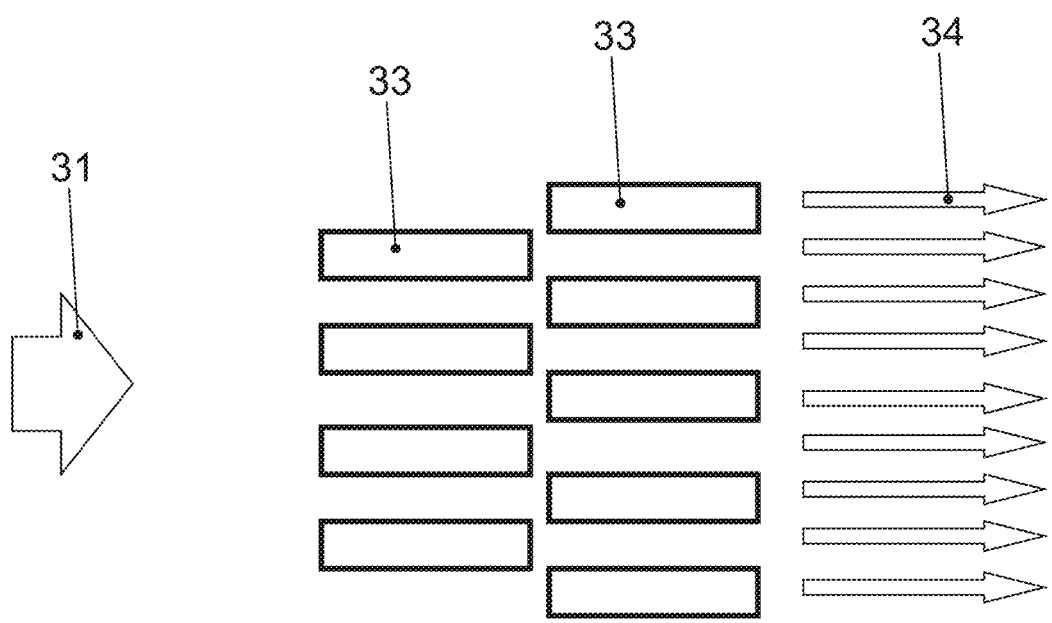
FIG. 20 is in schematic form a plan view of an eleventh example implementation of an apparatus in accordance with the disclosure.

FIG. 20 also shows an example implementation of the disclosure, in which on the input side there is not a plurality of laser beams, but rather there is a laser radiation 31 with a linear intensity distribution, with the line of the linear intensity distribution extending in the vertical direction in FIG. 20. However, in this case, a lens array is not used to split the laser radiation 31. Instead, the deflecting elements 33 are arranged offset, as in the example implementations according to FIG. 17 and FIG. 18. The laser radiation 31 is subdivided into a plurality of partial beams 34 by the deflecting elements 33, which are arranged on the left side in FIG. 20. This is because a part of the laser radiation passes through the deflecting elements 33 and another part passes by the deflecting elements 33.

FIG. 21 and FIG. 22 show an example implementation in which a partially reflecting dividing mechanism 35 is provided. At the dividing mechanism 35, the reflecting surfaces 36, from which partial beams 34 of the laser radiation 31 can be reflected upwards in FIG. 21, alternate in each case side by side with gaps 37, through which the partial beams 34' of the laser radiation 31 pass unimpeded. Then the partial beams 34', which have passed through unimpeded, can be suitably deflected by the deflecting elements 38, which are indicated only in schematic form, for example, designed as transparent components, or alternatively modulated.

FIG. 22 shows that the partial beams 34, which are deflected upwards from the reflecting surfaces 36, are deflected or alternatively modulated by optionally additional deflecting elements 39, which are designed as transparent components, and are deflected from a mirror 44 to the right in FIG. 22. At the same time, the partial beams 34', which have passed through unimpeded, are deflected or alternatively modulated by deflecting elements 38, which are also designed as transparent components, and are deflected upwards by an additional mirror 45 shown in FIG. 22. All of the partial beams 34, 34' are deflected from a recombining mechanism 40, which corresponds to the dividing mechanism 35 and has reflecting surfaces and gaps (not shown) that are arranged alternatingly, to the right or are allowed to pass through.

On the whole, the laser radiation 31 can be suitably modulated through targeted movements of the individual deflecting elements 38, 39. As a result, this example implementation of an apparatus in accordance with the disclosure is also suitable, for example, for use in a 3D printing apparatus.

FIGS. 23 to 25 show an example implementation, in which a fast axis collimating lens 10 behind a laser diode bar 7 is subdivided, as in FIG. 9, into individual segments. In FIG. 23 and FIGS. 24a and 24b, the individual segments of the fast axis collimating lens 10 are connected in each case to a respective piezo actuator 5, such that they can be moved upwards and downwards in FIGS. 23 to 24b. In this way, a smile compensation can be achieved by targeted positioning of the individual segments of the fast axis collimating lens 10. In the example implementation shown, the plurality of piezo actuators 5 are arranged on a common holder 41.

FIG. 24a shows the passage of a laser beam 2 through a segment of the fast axis collimating lens 10, wherein it is apparent that the laser beam 2, emanating from the corresponding emitter 7, contributes to a smile distortion. FIG. 24b shows the passage of the laser beam 2 through the segment (already shown in FIG. 24a) after a corresponding correction by a movement of the piezo actuator 5. In the corrected position shown in FIG. 24b, an adhesive 42, for example, a photosensitive adhesive, which may be found between the segment of the fast axis collimating lens 10 and a fastening element 9, which is designed, for example, as a glass rod, may be applied and/or activated.

After adjusting and securing by adhesive bonding all of the positions of the segments of the fast axis collimating lens 10 that are suitable for the smile compensation, the piezo actuators 5 can be removed together with the holder 41 (see, for example, FIG. 25).

Figure 26:
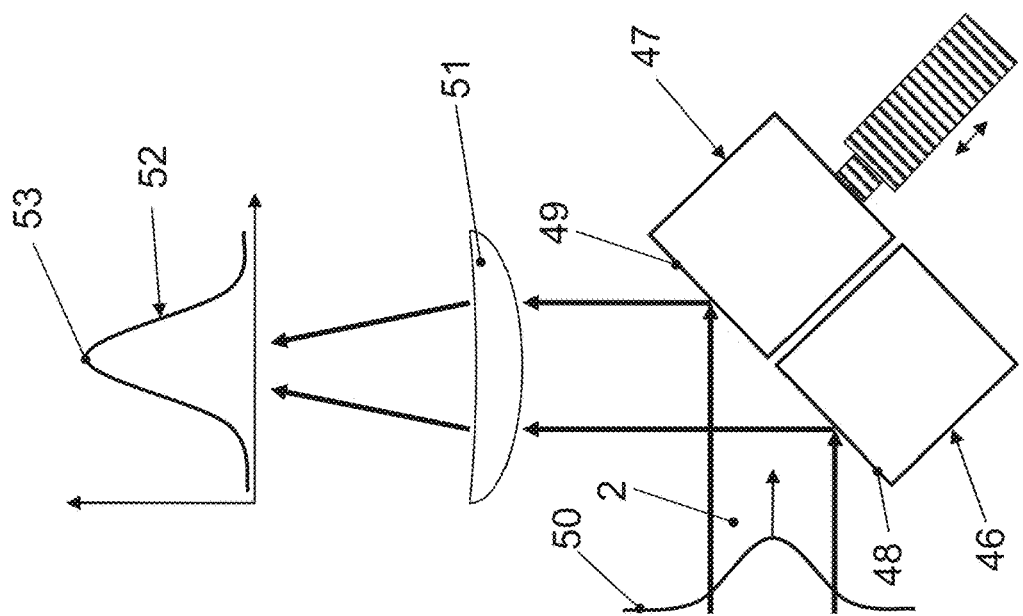
FIG. 26 is in schematic form a plan view of a fourteenth example implementation of an apparatus in accordance with the disclosure in a first position of a deflecting element.

Apparent from FIG. 26 is an apparatus that comprises two deflecting elements, designed as mirror elements 46, 47. Between the two mirror elements 46, 47 only a very narrow gap is provided. In this case, the first mirror element 46, which is located on the left in FIG. 26, is not movable or, more specifically, not provided with a piezo actuator 5, whereas the second mirror element 47, which is located on the right in FIG. 26, is provided with a piezo actuator 5 and, therefore, is movable relative to the first mirror element 46. The mirror elements 46, 47 can be produced, for example, by sawing or cutting a mirror into two parts.

A laser beam 2, coming from the left in FIG. 26, impinges on first and second reflecting surfaces 48, 49 of the mirror elements 46, 47 at an angle of, for example, 45° and is reflected upwards from the surfaces in FIG. 26. The laser beam 2 has, for example, a Gaussian profile 50, as indicated in FIG. 26. The upwards reflected laser beam 2 is focused by a lens 51 and has a Gaussian intensity distribution 52 with a central maximum 53 in the focal plane.

Figure 27:
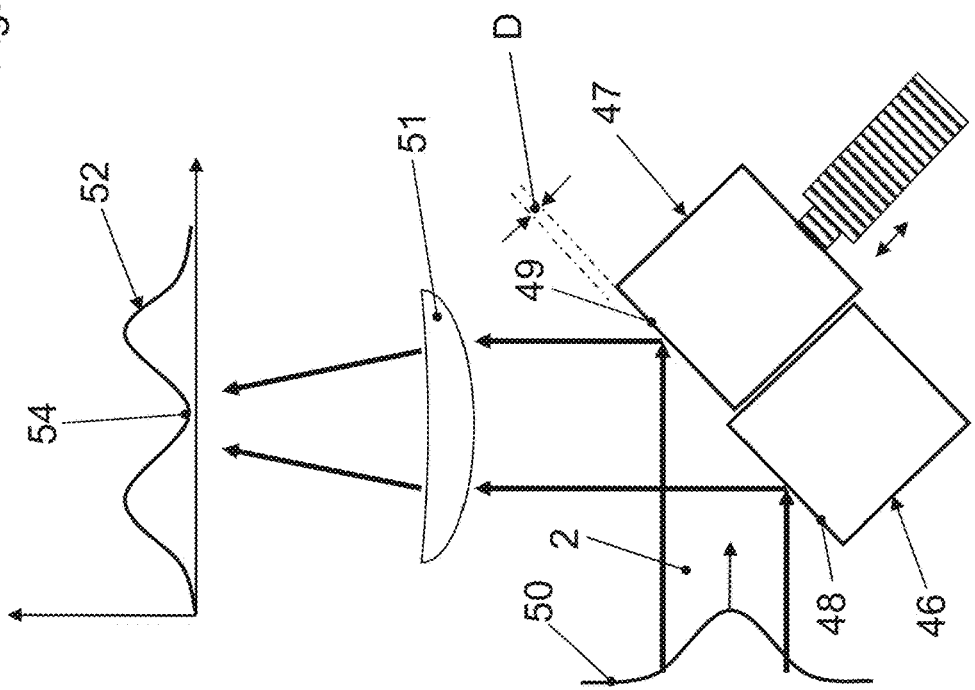
FIG. 27 is in schematic form a plan view of the apparatus, according to FIG. 26, in a second position of a deflecting element.

FIG. 27 shows the same apparatus, in which, however, the second mirror element 47 is displaced with respect to the first mirror element 46 by a distance D, where $$D = \frac{\lambda}{\sqrt{2}}.$$

In this case, λ is the wavelength of the laser beam 2. In this way, the second reflecting surface 49 of the second mirror element 47 is set back with respect to the first surface 48 of the first mirror element 46 by a distance D. As a result, the part of the laser beam 2 that is reflected at the second surface 49 undergoes a phase shift of π relative to the part of the laser beam 2 that is reflected at the first surface 48. Thus, the optical path traveled by the part of the laser beam 2 that is reflected at the second surface 49 is larger by λ/2 than the optical path traveled by the part of the laser beam 2 that is reflected at the first surface 48.

This results, given a corresponding spatial coherence of the laser beam 2, in a central minimum 54 being formed due to the destructive interference in the intensity distribution 52. Therefore, the intensity of individual laser beams 2 in a working plane can be reduced significantly to completely by the deflecting elements that are designed as mirror elements 46, 47, so that, on the whole, a laser radiation, consisting of a plurality of laser beams 2, can be suitably modulated. As a result, this example implementation of an apparatus in accordance with the disclosure is also suitable, for example, for use in a 3D printing apparatus. The distance D can be suitably adjusted for entry angles of the laser beam 2 that deviate from 45°, so that the result is a phase shift of 7C or, more specifically, an optical path difference of λ/2.

What is claimed is:

1. An apparatus for deflecting and/or modulating a laser radiation, the apparatus comprising:
   a plurality of deflecting elements arranged in at least a first group and a second group; and
   a movement apparatus configured to move the plurality of deflecting elements individually or in groups,
   wherein the movement apparatus comprises a plurality of actuators configured to perform a translatory motion,
   wherein each of the first group and the second group has respective deflecting elements arranged side by side at a distance from each other in a first direction that is perpendicular to a second direction in which the laser radiation is propagated, and
   wherein the first group and the second group are offset from each other in the second direction such that the respective deflecting elements of the first group are positioned to align with first gaps between the respective deflecting elements of the second group and the respective deflecting elements of the second group are positioned to align with second gaps between the respective deflecting elements of the first group.

2. The apparatus of claim 1, wherein each deflecting element of the plurality of deflecting elements is assigned an actuator configured to move the deflecting element.

3. The apparatus of claim 1, wherein the deflecting elements are displacable and/or pivotable about an axis.

4. The apparatus of claim 1, wherein the deflecting elements comprise mirror elements.

5. The apparatus of claim 1, wherein each of the deflecting elements comprises a transparent component through which the laser radiation to be deflected passes.

6. The apparatus of claim 5, wherein the transparent component is a plane-parallel plate.

7. The apparatus of claim 5, wherein the transparent component is a lens or a lens segment.

8. The apparatus of claim 1, wherein each of the deflecting elements comprises two transparent components which are opposite one another and through which the laser radiation to be deflected passes, wherein the two transparent components are movable relative to one another in a direction perpendicular to a direction of propagation of the laser radiation.

9. The apparatus of claim 8, wherein the two transparent components have mutually corresponding contours that are arranged on opposite sides of the two components.

10. The apparatus of claim 1, wherein the laser radiation is a plurality of laser beams emanating from a laser diode bar, wherein the laser diode bar includes emitters each emitting one of the laser beams.

11. The apparatus of claim 1, wherein the apparatus is usable for smile compensation of a laser diode bar.

12. The apparatus of claim 1, wherein the deflecting elements comprise first and second mirror elements arranged such that a part of a laser beam is reflected at each of the mirror elements, wherein the second mirror element is movable relative to the first mirror element by one of the actuators so that, when the mirror elements are suitably positioned with respect to one another, intensity of the laser beam in a working plane is reduced by destructive interference.

13. The apparatus of claim 1, wherein the laser radiation comprises a plurality of laser beams.

14. The apparatus of claim 1, wherein the actuators comprise piezo actuators.

15. A method for smile compensation of a laser diode bar comprising:
    using the apparatus of claim 1 to carry out smile compensation of the laser diode bar.

16. An apparatus for deflecting and/or modulating a laser radiation, the apparatus comprising:
    a plurality of deflecting elements; and
    movement apparatus configured to move the plurality of deflecting elements individually or in groups, wherein the movement apparatus comprises a plurality of actuators configured to perform a translatory motion; and
    a partially reflecting dividing mechanism in which reflecting surfaces, from which first partial beams of the laser radiation is reflected, alternate side by side with gaps through which second partial beams of the laser radiation pass unimpeded, wherein the first and second partial beams are deflected or modulated by the plurality of deflection elements.

17. The apparatus of claim 16, wherein the plurality of deflecting elements comprise mirror elements.

18. The apparatus of claim 16, wherein each deflecting element of the plurality of deflecting elements is assigned an actuator configured to move the deflecting element.

\* \* \* \* \*